United States Patent [19]

Nakata et al.

[11] Patent Number: 5,285,059

[45] Date of Patent: Feb. 8, 1994

[54] METHOD FOR CONTROLLING A TUNABLE FILTER AND AN APPARATUS THEREFOR

[75] Inventors: Tohru Nakata, Ebina; Kenji Nakamura, Hadano, both of Japan

[73] Assignee: Canon Kabushiki Kaisha, Tokyo, Japan

[21] Appl. No.: 53,309

[22] Filed: Apr. 27, 1993

Related U.S. Application Data

[63] Continuation of Ser. No. 967,530, Oct. 27, 1992, abandoned, which is a continuation of Ser. No. 784,268, Oct. 29, 1991, abandoned.

[30] Foreign Application Priority Data

Oct. 31, 1990 [JP] Japan .................. 2-294852
May 31, 1991 [JP] Japan .................. 3-155485

[51] Int. Cl.$^5$ ............................... G01J 1/32
[52] U.S. Cl. ......................... 250/205; 372/29
[58] Field of Search .......... 250/205, 201.1, 226; 372/32, 29, 99; 359/124, 133, 194, 285, 330

[56] References Cited

U.S. PATENT DOCUMENTS 4,841,519 6/1989 Nishio .................. 359/133
4,947,398 8/1990 Yasuda et al. ............ 372/32

FOREIGN PATENT DOCUMENTS 58-052890 3/1983 Japan .
2-140028 5/1990 Japan .

OTHER PUBLICATIONS

"Method of setting tunable optical filters in a wavelength division multi-access system"; IBM Technical Disclosure Bulletin; vol. 31, No. 11; Apr. 1989, New York US.; pp. 271-274.

"A photonic wavelength division switching system using tunable lasser diode filters"; by: S. Suzuki et al. IEEE International Conference on Communications. Conference Record; vol. 2; Jun. 11, 1989, New York, US.; pp. 722-727.

"1.5 mum optical filter using a two-section Fabry-Perot lasser diode with wide tuning range and high constant gain"; by T. Numai; IEEE Photonics Technology Letters; vol. 2, No. 6 Jun. 1990, New York US.; pp. 402-403.

*Primary Examiner*—David C. Nelms
*Assistant Examiner*—Que T. Le
*Attorney, Agent, or Firm*—Fitzpatrick, Cella, Harper & Scinto

[57] ABSTRACT

An apparatus for controlling a tunable filter of the present invention includes a tunable filter, a generating device for generating a reference light whose wavelength is within a transmission wavelength band of the tunable filter, a detecting device for detecting an interaction signal, such as a beat signal, caused by interaction between a desired component of an input light to be input into the tunable filter and the reference light and a controlling device for controlling the tunable filter based on the interaction signal. The controlling device controls a current flow through a wavelength control terminal of the tunable filter such that a center filtering wavelength of the transmission wavelength band of the tunable filter substantially coincides with a wavelength of the desired component.

59 Claims, 10 Drawing Sheets

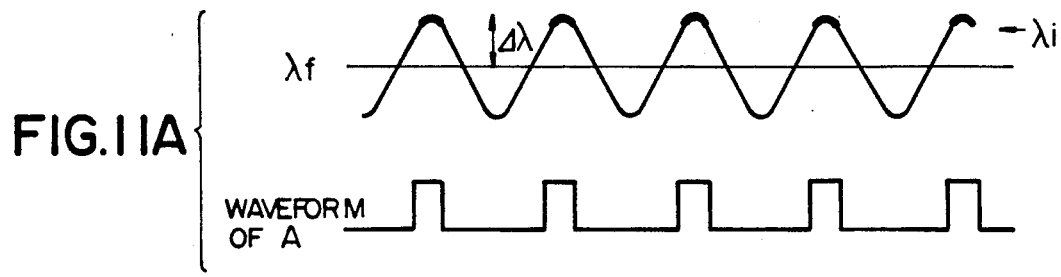
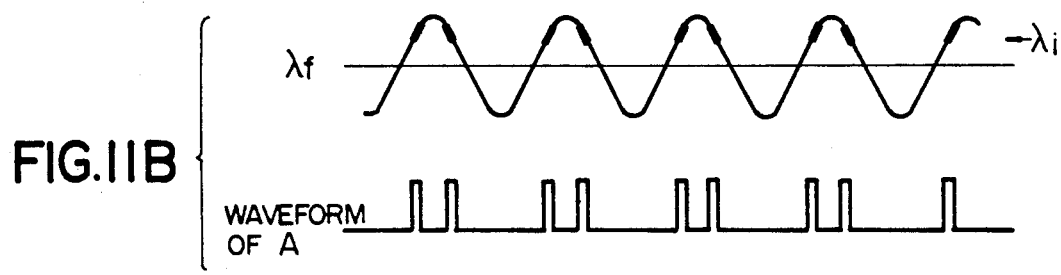
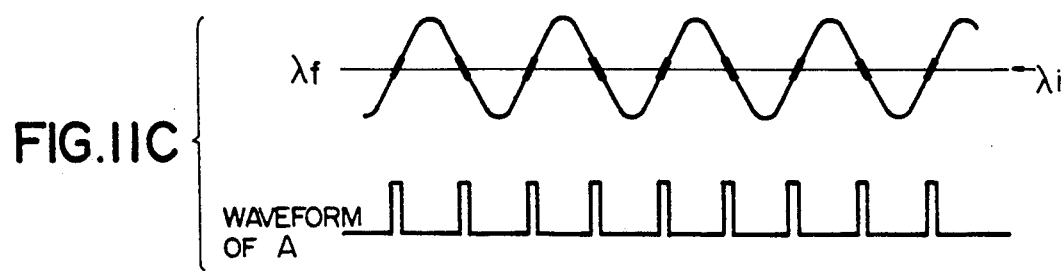
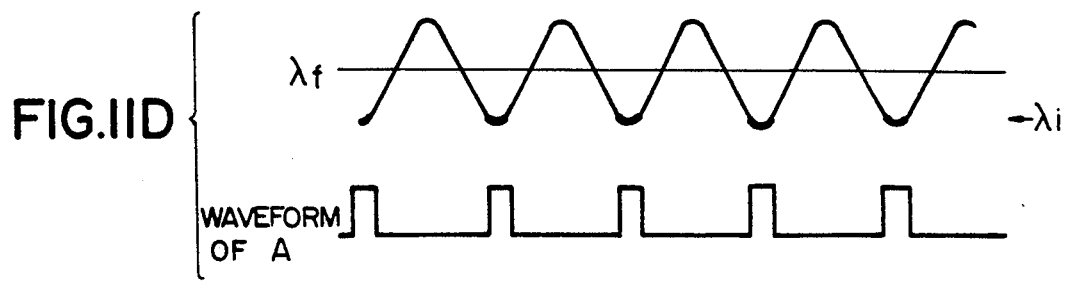

METHOD FOR CONTROLLING A TUNABLE FILTER AND AN APPARATUS THEREFOR

This application is a continuation of application Ser. No. 07/967,530 filed Oct. 27, 1992, now abandoned which is a continuation of application Ser. No. 07.784,268 filed Oct. 29, 1991, abandoned.

BACKGROUND OF THE INVENTION

1. Field of the Invention

The present invention relates to a method for controlling a tunable filter to be utilized in wavelength or frequency division multiplexing systems or the like, an apparatus therefor and an optical communication network including such apparatus.

2. Related Background Art

In general, a tunable filter has a transmission coefficient for a wavelength of light to be input therein as shown in FIG. 1. When multiplexed optical signals of different wavelengths are input into such tunable filter, a signal of wavelength selected according to the relationship between wavelength and transmission coefficient of the tunable filter is filtered out. Normally, a signal of a single wavelength is taken out of the multiplexed signals of different wavelengths input into the tunable filter since a wavelength interval between adjacent signals of the multiplexed signals is wider than a half-value width (wavelength width at a transmission coefficient whose value is a half or 50% of that of a maximum transmission coefficient: see FIG. 1) of the tunable filter. The intensity of the selected or filtered signal is at its maximum when a center transmission or filtering wavelength of the tunable filter is coincident with that to be selected.

Usually, the center filtering wavelength of a tunable filter can be changed or tuned by controlling a current flow through a terminal thereof for changing its filtering wavelength. Therefore, if the relationship between a value of such current flow and the center filtering wavelength is already known, a signal of any desired wavelength can be filtered out by causing the current corresponding to the desired wavelength to flow through a filtering-wavelength changing terminal of the tunable filter.

FIG. 2 shows an example of prior art methods for controlling a tunable filter. In FIG. 2, a voltage-to-current (V-I) converter 201 and a constant current source 202 are connected to a tunable filter 203. In the prior art method, the relationship between a filtering wavelength control current and a filtering wavelength of the tunable filter 203 needs to be accurately measured in the first place. The measurement is conducted under a condition under which temperature is stably set to a predetermined value since the filtering wavelength control current-dependent filtering wavelength characteristic of the tunable filter 203 is greatly varied due to the change in temperature.

The relationship between the filtering wavelength of the tunable filter 203 and a wavelength selection control signal input to the converter 201 is thus determined from the above-mentioned measured value, considering a voltage-current converting characteristic of the converter 201. Further, a gain control current-to-gain characteristic of the tunable filter 203 is measured.

The operation of the prior art system is as follows. First, the temperature is set to the predetermined value at the time of measurement. Then, the gain control current is caused to flow into the tunable filter 203 through its gain control terminal by the current source 202 to set a gain of the tunable filter 203 to a given value. Further, the wavelength selection control signal is set to a voltage corresponding to a wavelength of any desired siganl. This control voltage is converted into a current by the voltage-to-current converter 201, and this current is caused to flow into the tunable filter 203 through its wavelength control terminal.

Thus, the filtering wavelength of the tunable filter 203 is set to the wavelength of the desired signal. When multiplexed signals of different wavelengths are input into the tunable filter 203, the signal of the desired wavelength is output pursuant to a transmission factor characteristic of the tunable filter 203 since the center filtering wavelength of the tunable filter 203 is coincident with that of the signal desired to be output.

In the prior art system, however, when the wavelength of an input signal or center filtering wavelength of the tunable filter 203 is changed, an amount of the signal light to be output is reduced. In the worst case, the desired signal will not be output at all. As a result, temperature stabilization circuits are required for stabilizing the wavelength of an input light emitted from a light source (i.e., stabilizing a laser diode for emitting a light signal) and the center filtering wavelength of the tunable filter 203. Further, a highly precise and stable voltage-to-current converting circuit 201 with little variance is required for accurately setting the value of current to be supplied to the wavelength control terminal of the tunable filter 203.

However, it is difficult to always maintain the center filtering wavelength of the tunable filter 203 at a constant value since techniques for realizing the converting circuit 201 mentioned above are hard to achieve.

Moreover, the current-to-wavelength characteristic of the tunable filter 203 must be accurately measured beforehand, so that the number of steps of a process for controlling the tunable filter 203 will be increased.

For solving the above-discussed problem, there may be a solution that a transmission band of a tunable filter is made wide enough to cope with wavelength fluctuations, but this solution inevitably restricts the possible multiplexing number of signals of different wavelengths.

SUMMARY OF THE INVENTION

An object of the present invention is to provide a method for controlling a tunable filter and an apparatus therefor in which a signal of any desired wavelength can always be taken out stably even if wavelength or center wavelength of an input light signal or the tunable filter is changed.

Another object of the present invention is to provide an optical communication network including such apparatus for controlling the tunable filter in which the number of multiplexed wavelengths is not restricted and an excellent light receiving function is obtained at a relatively cheap cost.

According to one aspect of the present invention, a method for controlling a tunable filter of the present invention comprises a step of generating a reference light whose wavelength is within a transmission wavelength band of the tunable filter, a step of detecting an interaction signal caused by interaction between a desired component of an input light to be input into the tunable filter and the reference light and a step of controlling the tunable filter based on the interaction signal such that a center filtering wavelength of the transmission wavelength band of the tunable filter substantially coincides with a wavelength of the desired component.

According to another aspect of the present invention, a method for controlling a tunable filter of the present invention comprises a step of generating a DC light by the tunable filter, a step of detecting a beat signal caused by interaction between the DC light and a desired light signal of multiplexed input light signals of a plurality of wavelengths to be input into the tunable filter and a step of controlling the tunable filter based on the beat signal such that a center wavelength of the DC light substantially coincides with the wavelength of the desired light signal. The desired light signal has a wavelength nearest to that of the DC light in a plurality of the wavelengths.

According to a further aspect of the present invention, a method for controlling a tunable filter of the present invention comprises a step of generating a DC light by a local oscillator, a step of detecting a beat signal caused by interaction between the DC light and a desired light signal of multiplexed input light signals of a plurality of wavelengths to be input into the tunable filter and a step of controlling the tunable filter and the local oscillator based on the beat signal such that the center filtering wavelength of the tunable filter substantially coincides with the wavelength of the desired light signal. The local oscillator is controlled such that a center wavelength thereof substantially coincides with a center filtering wavelength of the tunable filter. The desired light signal has a wavelength nearest to that of the DC light in a plurality of the wavelengths.

According to a further aspect of the present invention, a method for controlling a tunable filter of the present invention comprises a step of inputting multiplexed input lights of a plurality of wavelengths into the tunable filter, a step of producing part of the input lights and part of an output light from the tunable filter by branching the input lights and the output light, a step of receiving the part of the input lights and the part of the output light by light receiving means having a nonlinear characteristic to generate a beat signal caused by interaction between a light of a desired wavelength of the input lights and the part of the output light and a step of controlling the tunable filter based on the beat signal such that a center filtering wavelength of the tunable filter substantially coincides with the desired wavelength.

According to one aspect of the present invention, an apparatus for controlling a tunable filter of the present invention comprises a tunable filter, a generating device for generating a reference light whose wavelength is within a transmission wavelength band of the tunable filter, a detecting device for detecting an interaction signal caused by interaction between a desired component of an input light to be input into the tunable filter and the reference light and a controlling device for controlling the tunable filter based on the interaction signal such that a center filtering wavelength of the transmission wavelength band of the tunable filter substantially coincides with a wavelength of the desired component.

According to another aspect of the present invention, an apparatus for controlling a tunable filter of the present invention comprises a tunable filter, a generating device for causing the tunable filter to generate a DC light, a detecting device for detecting a beat signal caused by interaction between the DC light and a desired light signal of multiplexed input light signals of a plurality of wavelengths to be input into the tunable filter and a controlling device for controlling the tunable filter based on the beat signal such that a center wavelength of the DC light substantially coincides with the wavelength of the desired light signal. The desired light signal has a wavelength nearest to that of the DC light in a plurality of the wavelengths.

According to a further aspect of the present invention, an apparatus for controlling a tunable filter of the present invention comprises a tunable filter, a local oscillator for generating a DC light, a detecting device for detecting a beat signal caused by interaction between the DC light and a desired light signal of multiplexed input light signals of a plurality of wavelengths to be input into the tunable filter and a controlling device for controlling the tunable filter and the local oscillator based on the beat signal such that the center filtering wavelength of the tunable filter substantially coincides with the wavelength of the desired light signal. The local oscillator is controlled such that a center wavelength thereof substantially coincides with a center filtering wavelength of said tunable filter. The desired light signal has a wavelength nearest to that of the DC light in a plurality of the wavelengths.

According to a further aspect of the present invention, an apparatus for controlling a tunable filter of the present invention comprises a tunable filter, a light combining device, a first light branching device for branching multiplexed input lights of a plurality of wavelengths into part thereof toward the tunable filter and the remaining thereof toward the light combining device, a second light branching device for branching an output light from the tunable filter into a received signal and the remaining thereof toward the light combining device, a receiving device having a nonlinear characteristic for receiving an output light from the light combining device to generate a beat signal caused by interaction between a light of a desired wavelength of the input lights and the part of the output light from the tunable filter and a controlling device for controlling the tunable filter based on the beat signal such that a center filtering wavelength of the tunable filter substantially coincides with the desired wavelength.

These advantages and others will be more readily understood in connection with the following detailed description of the preferred embodiment in conjunction with the drawings.

BRIEF DESCRIPTION OF THE DRAWINGS

FIGS. 11A-D are representation illustrating waveforms for explaining the operation of the fifth embodiment.

DESCRIPTION OF THE PREFERRED EMBODIMENT

Figure 1:
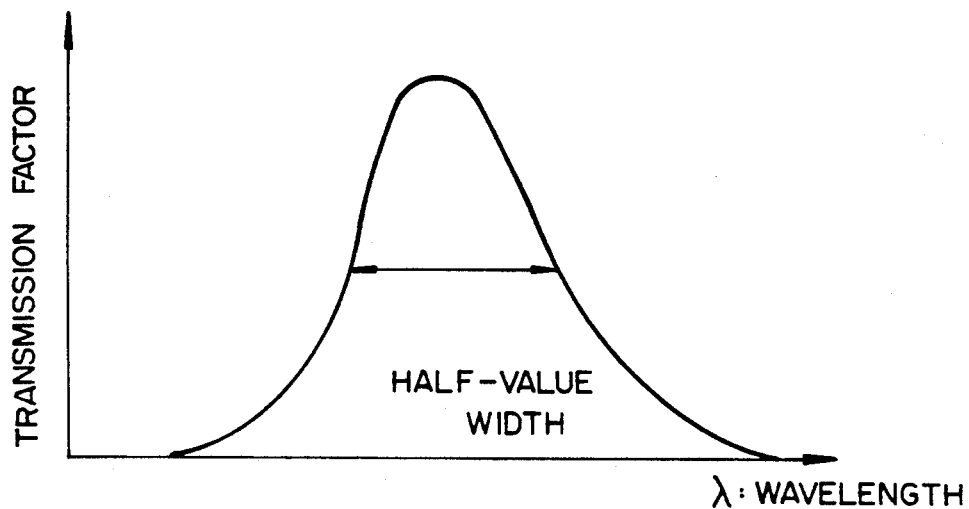
FIG. 1 is a representation illustrating a wavelength dependent transmission coefficient characteristic of a tunable filter.
Figure 2:
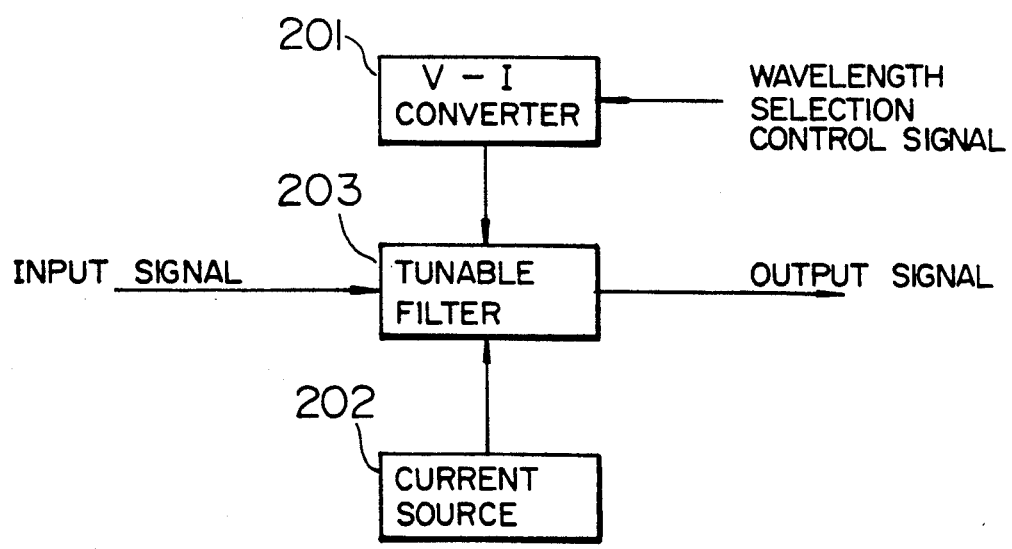
FIG. 2 is a block diagram illustrating the structure of a prior art system for controlling a tunable filter.
Figure 3:
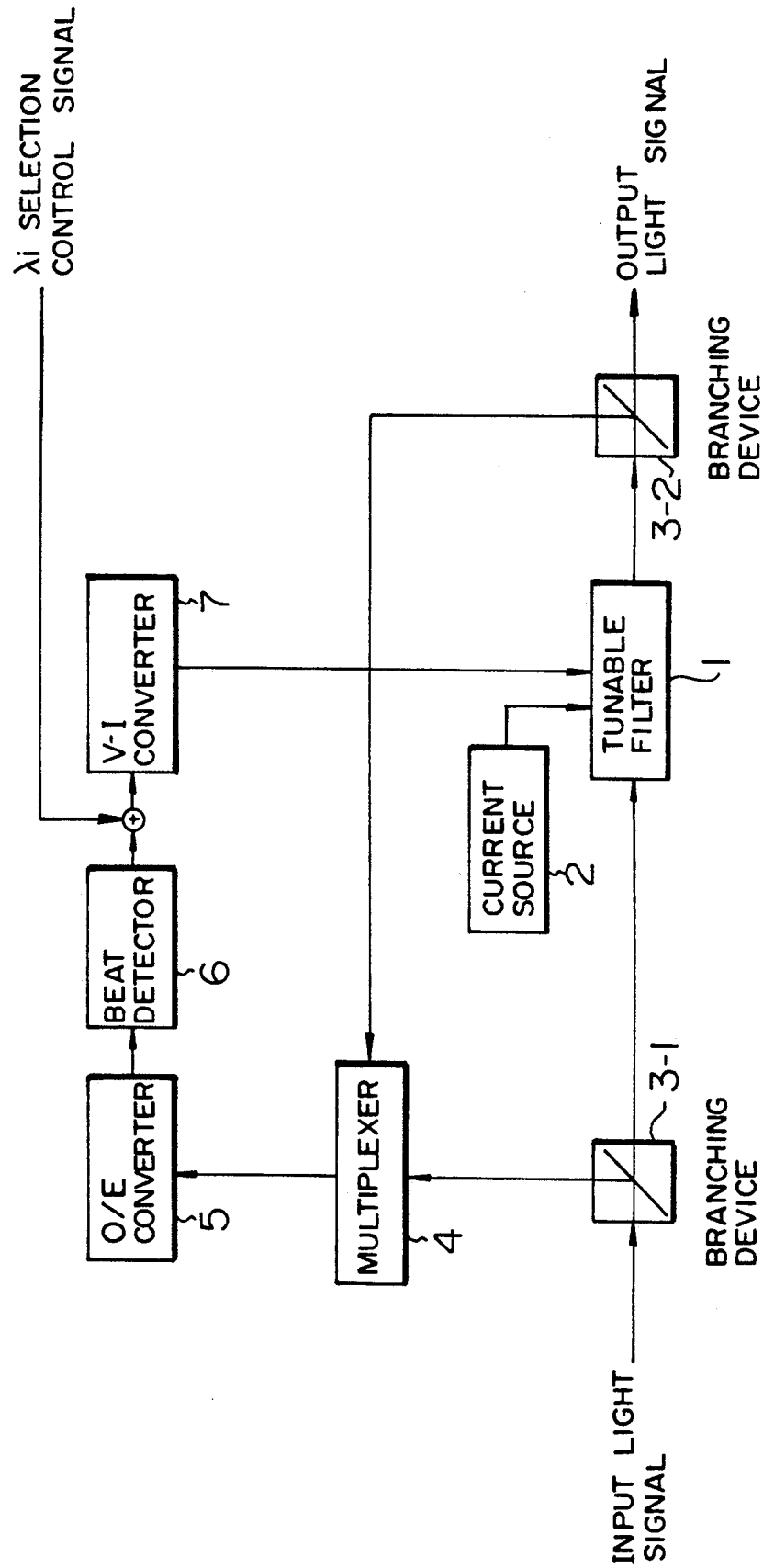
FIG. 3 is a block diagram showing the structure of a first embodiment according to the present invention.
Figure 4:
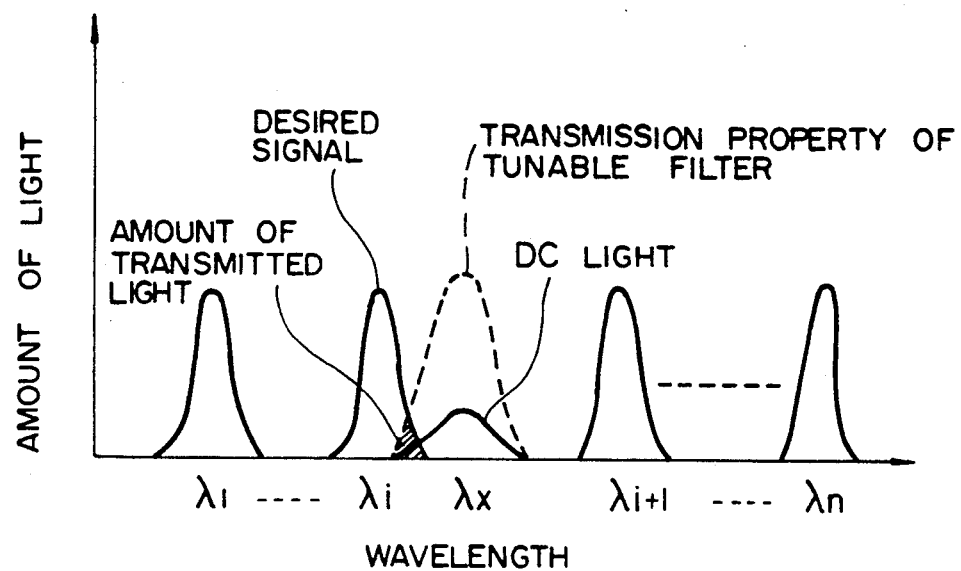
FIG. 4 is a representation illustrating the relationship between input light signals and transmission property of a tunable filter.
Figure 5:
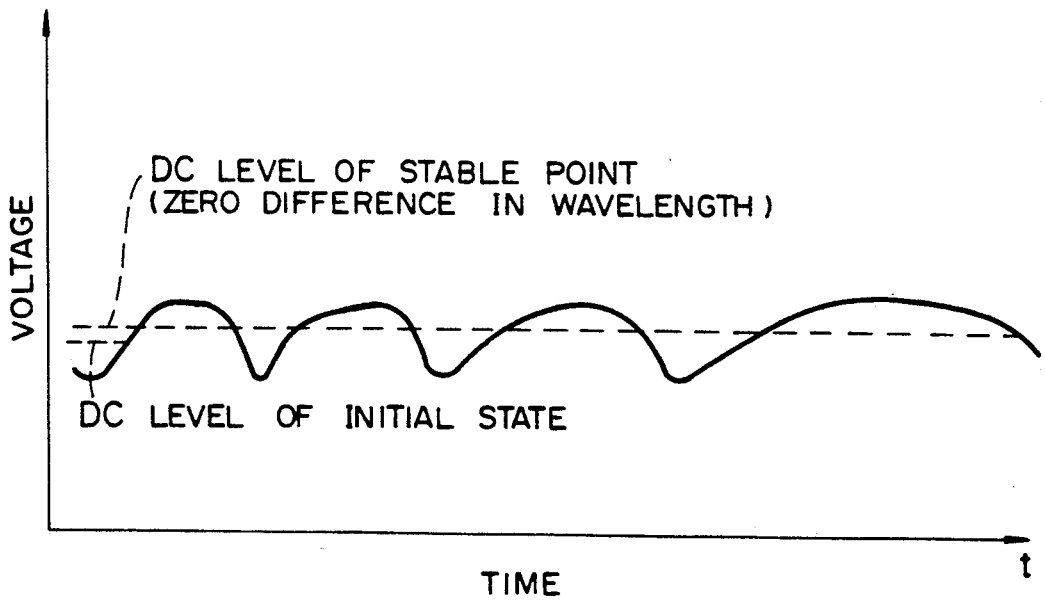
FIG. 5 is a representation illustrating a voltage waveform of an output from a beat detector.

FIG. 3 shows a first embodiment of the present invention, and FIG. 4 illustrates the relationship between input light signals, wavelength transmission property or characteristic of a tunable filter and an amount of light transmitted through the tunable filter. FIG. 5 illustrates a waveform of voltage output from a beat detector in FIG. 3.

In FIG. 3, there are provided a tunable filter 1 to be controlled in a system of the present invention, a current source 2 connected to a gain control terminal of the tunable filter 1 for determining a gain of the filter 1, light branching devices 3-1 and 3-2 and a multiplexer 4. The branching device 3-1 functions to supply part of the input light signal to the multiplexer 4 and supply the remaining thereof to the tunable filter 1. The branching device 3-2 functions to supply part of an output light signal of the tunable filter 1 to the multiplexer 4 and take out the remaining thereof as an output light signal. The multiplexer 4 multiplexes the light signals from the branching devices 3-1 and 3-2 and inputs multiplexed signals into an opto-electric (O/E) converter 5 for converting the multiplexed signals into an electric signal.

There are further provided a beat detector 6 for detecting a beat signal which is to be generated due to a difference in wavelength between those of any desired signal out of output signals from the O/E converter 5 and the output light signal from the tunable filter 1, and a voltage-to-current converter 7 for converting a voltage of the sum of a wavelength selection control signal and a beat detection output of the beat detector 6 into a current to cause such current to flow through a wavelength control terminal of the filter 1 as a wavelength selection control current.

The tunable filter 1 has functions to set its transmission factor and its output light power by controlling a current flow through its gain control terminal and to set its center filtering wavelength to a desired value by controlling the current flow through its wavelength control terminal. As the tunable filter 1, a distributed feedback (DFB) laser type filter and the like can be used (see, for example, Numai et al.: Tunable filter using a phase shift type DFBLD. Informal Paper No. C-161 distributed at Autumnal Grand Meeting of Electronics Information Commun. Academy (1988)).

As the O/E converter 5, a PIN photodiode, an avalanche photodiode or the like can be utilized, and as the beat detector 6, a circuit composed of an intermediate frequency (IF) amplifier, a low-pass filter and so forth can be employed.

In the system of FIG. 3, an initial setting is performed in the following manner. The current source 2 is connected to the gain control terminal of the tunble filter 1, and a current of such magnitude as can a little oscillate the filter (i.e., current a little above its threshold) is caused to flow through the gain control terminal. The wavelength selection control signal is set to a desired value, based on the relationship between the wavelength control current and the center filtering wavelength, such that a current corresponding to a wavelength desired to be taken out is caused to flow through the wavelength control terminal of the tunable filter 1. As a result, the wavelength selection control signal is converted into a current by the voltage-to-current converter 7, and a desierd wavelength control current is supplied to the wavelength control terminal of the tunable filter 1. Thus, the tunable filter 1 radiates a DC current of a preset wavelength pursuant to the above-mentioned setting (see FIG. 4).

When a DFB laser or the like is used as the tunable filter 1, the tunable filter 1 also emits a DC current in an input direction (direction toward the branching device 3-1). If this DC current becomes disturbances in the associated system, an isolator is preferably disposed between the branching device 3-1 and the tunable filter 1 or at an input portion of the branching device 3-1 for preventing the DC current from traveling toward the input portin of the branching device 3-1.

Next, the operation will be explained when multiplexed light signals of plural different wavelengths are input into the first embodiment. In FIG. 4, the input light signals have wavelengths $\lambda_1, \ldots, \lambda_i, \ldots, \lambda_n$ and a wavelength $\lambda_x$ is a center filtering wavelength of the tunable filter 1 at an initial state thereof and a wavelength $\lambda_i$ is one of any desired light signal to be taken out.

When the wavelengths $\lambda_x$ and $\lambda_i$ differ from each other, only part of the input light signal input into the tunable filter 1 through the branching device 3-1 (indicated by hatching in FIG. 4) is transmitted through the tunable filter 1, due to a setting error of the center filtering wavelength $\lambda_x$ of the tunable filter 1 or difference between the center filtering wavelength $\lambda_x$ and the wavelength $\lambda_i$ of the desired light signal. When the setting error is zero ($\lambda_x = \lambda_i$), a maximum amount of light transmits through the tunable filter 1.

Thus, the DC current of wavelength $\lambda_x$ and part of the desired signal of wavelength $\lambda_i$ are output from the tunable filter 1. The output of the tunable filter 1 is branched by the branching device 3-2, and part thereof is taken out toward the multiplexer 4 while the remaining thereof is taken out as an output light signal. Here, part of the input light signal and part of the output light from the tunable filter 1 are multiplexed and the multiplexed lights are converted into an electric signal. The O/E converter 5 outputs beat frequencies corresponding to wavelength differences between the wavelength $\lambda_x$ of the DC current of the tunable filter 1 and wavelengths $\lambda_1$-$\lambda_n$ of the input light signals. The smaller the frequency difference is, the lower the beat frequency becomes. Therefore, the beat frequency produced between the DC current of wavelength $\lambda_x$ and the desired light signal of wavelength $\lambda_i$ is the lowest. The beat detector 6 detects a component of such beat frequency created between the lights of wavelengths $\lambda_x$ and $\lambda_i$ by using, for example, a low-pass filter and etc.

Here, it is easy to detect the beat frequency component if amounts of lights of wavelengths $\lambda_x$ and $\lambda_i$ input into the multiplexer 4 are about equal to each other. Therefore, the beat frequency can be detected more stably if the branching devices 3-1 and 3-2 are respectively, for example, such devices that always supply a constant amount of branched light to the multiplexer 4, or if optical amplifiers with an automatic gain control (AGC) function are respectively disposed at two input portions of the multiplexer 4.

The beat frequency voltage detected by the beat detector 6 is then added to the wavelength selection control signal to control the output current of the voltage-to-current converter 7. Thus, the center filtering wavelength of the tunable filter 1 is changed.

FIG. 5 illustrates a time-dependent change of the output voltage of the beat detector 6. The output current of the voltage-to-current converter 7 varies in the same manner or exhibits the same waveform as that of the output voltage of the beat detector 6 shown in FIG. 5. Since the wavelength control current supplied to the wavelength control terminal of the tunable filter 1 is changed as shown in FIG. 5, the center filtering wavelength of the tunable filter 1 is also changed repeatedly in a certain range about the wavelength $\lambda_x$ (see FIG. 4).

When the center filtering wavelength $\lambda_x$ of the tunable filter 1 approaches the wavelength $\lambda_i$ of the desired signal to be taken out, the beat frequency becomes low, while the beat frequency becomes high when the center filtering wavelength $\lambda_x$ of the tunable filter 1 goes away from the wavelength $\lambda_i$ of the desired signal to be taken out. As a result, the beat waveform is changed as shown in FIG. 5 and its DC component is changed in a direction approaching the wavelength $\lambda_i$ of the desired signal. The DC component or level is stabilized when the wavelength $\lambda_x$ of the tunable filter 1 coincides with the wavelength $\lambda_i$ of the desired signal. In other words, the voltage-to-current converter 7 into which the beat frequency voltage added to the wavelength selection control signal is input, is structered so as to operate in such manner. When the wavelengths $\lambda_x$ and $\lambda_i$ coincide with each other, a maximum amount of light of the desired signal of wavelength $\lambda_i$ transmits through the tunable filter 1.

If the wavelength $\lambda_i$ of the desired signal or the center filtering wavelength $\lambda_x$ of the tunable filter 1 varies due to the change of temperature around the associated devices or for other reasons, a beat frequency component corresponding to a new difference in wavelengths $\lambda_x$ and $\lambda_i$ is newly generated. Due to the new beat signal, the above-discussed operation is newly performed in a direction causing the wavelengths $\lambda_i$ and $\lambda_x$ to be coincident with each other.

When the wavelength $\lambda_i$ of the desired signal to be taken out is changed to another value, the center filtering wavelength of the tunable filter 1 is newly set to a new value near the value of wavelength of the newly desired signal by the wavelength selection control signal. Then, the operation is performed such that the newly set wavelength $\lambda_x$ will become coincident with the newly desired wavelength $\lambda_i$. Thus, a signal of the newly desired wavelength $\lambda_i$ is taken out from the tunable filter 1.

Figure 6:
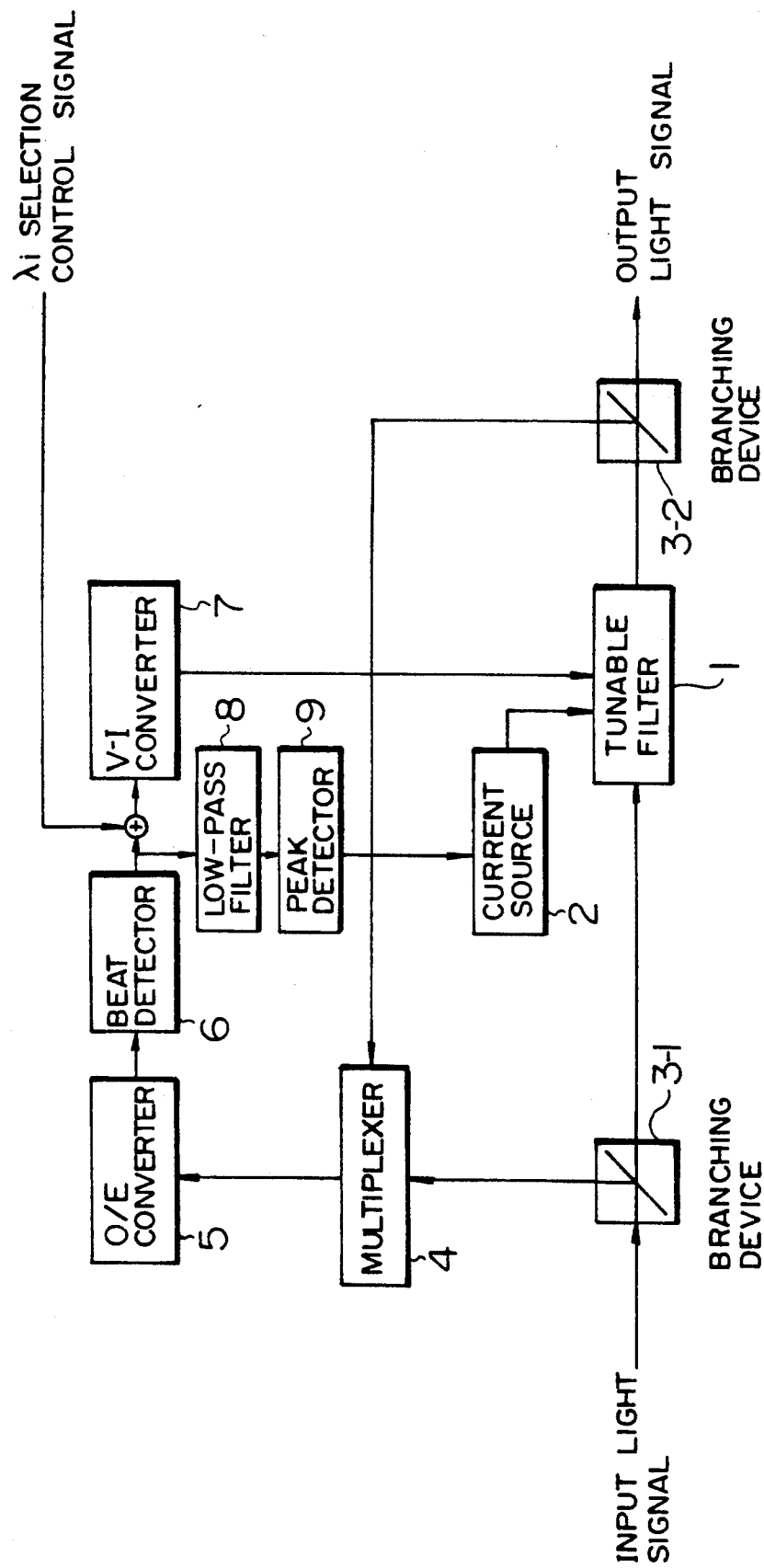
FIG. 6 is a block diagram showing the structure of a second embodiment according to the present invention.

FIG. 6 is a block diagram of a second embodiment. In FIG. 6, the same reference numerals as those in FIG. 3 denote the same members or devices as those shown in FIG. 3. In the second embodiment, there are further provided a low-pass filter 8 and a peak detector 9.

In the first embodiment, the amount of the DC light emitted from the tunable filter 1 is remains unchanged by keeping the amount of current from the current source 2 unchanged. In contrast, in the second embodiment, the amount of the DC light from the current source 2 is controlled to be decreased as the center filtering wavelength $\lambda_x$ of the tunable filter 1 approaches the wavelength $\lambda_i$ of the desired signal or as the center filtering wavelength $\lambda_x$ is stabilized.

When a light signal of the wavelength $\lambda_i$ is selected to be taken out by the wavelength selection control signal, the signal of the wavelength $\lambda_i$ is taken out through the tunable filter 1 pursuant to the same operation as that of the first embodiment. The output light signal of the first embodiment, however, contains the DC component (see FIG. 4) which is inherently an unwanted light. In the second embodiment, this unwanted DC light is decreased in the following manner.

The beat frequency of an output of the beat detector 6 becomes low as the difference between the wavelengths $\lambda_i$ and $\lambda_x$ is reduced as shown in FIG. 6. Since the output of the beat detector 6 is input into the low-pass filter 8, a beat frequency appears in an output of the low-pass filter 8 when the frequency of output of the beat detector 6 becomes below a predetermined frequency. The output of the low-pass filter 8 is peak-detected by the peak detector 9 to obtain a DC voltage according to the frequency of the output of the low-pass filter 8. A current from the current source 2 is changed according to the DC voltage from the peak detector 9, and hence the amount of the DC light from the tunable filter 1 is decreased as the difference between the wavelengths $\lambda_i$ and $\lambda_x$ is reduced. Namely, the gain of the tunable filter 1 is lowered. In other words, the current source 2 to which the DC voltage from the beat detector 9 is input, is formed such that a current supplied therefrom to the gain control terminal of the tunable filter 1 is varied in the above-discussed manner.

Thus, a signal of any desired wavelength $\lambda_i$ can be taken out as an output light signal while eliminating the DC light therefrom, in the second embodiment.

Figure 7:
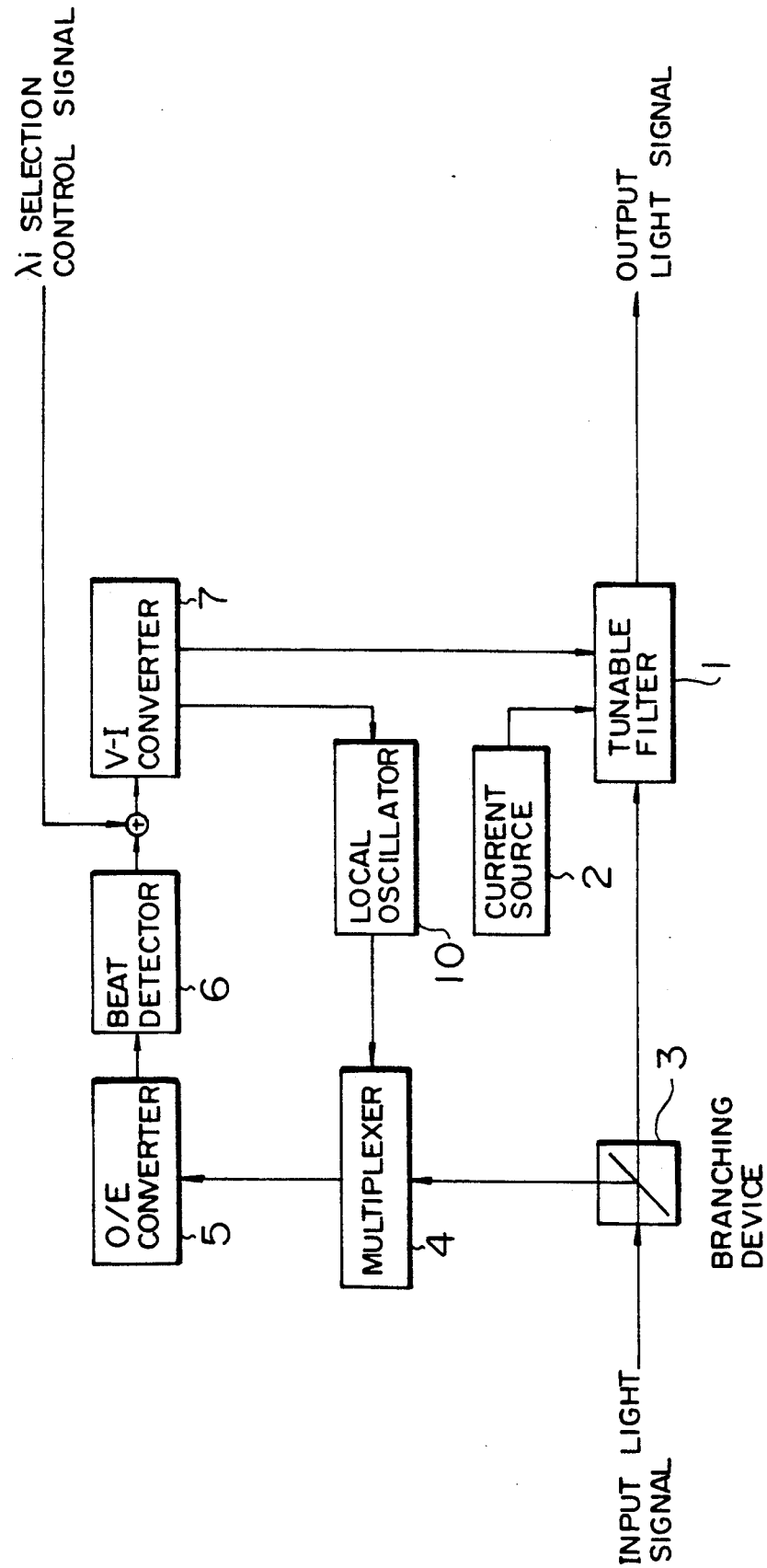
FIG. 7 is a block diagram showing the structure of a third embodiment according to the present invention.

FIG. 7 is a block diagram of a third embodiment. In FIG. 7, the same reference numerals as those in FIG. 3 denote the same members or devices as those shown in FIG. 3. In the third embodiment, there is further provided a local oscillator 10 having a wavelength control terminal. A DFB laser type can be used as the local oscillator 10 which can set a center wavelength of its output light according to a current caused to flow through its wavelength control terminal. While in the first embodiment the DC light of the tunable filter 1 is used to generate a beat signal, a DC current of the local oscillator 10 is used to generate the beat signal in the third embodiment. The voltage-to-current converter 7 respectively supplies currents to the tunable filter 1 and the local oscillator 10 such that the center wavelength of transmission factor of the tunable filter 1 is coincident with the center wavelength of output light from the local oscillator 10. Thus, the same operation as that of the first embodiment can be obtained in the third embodiment. It is naturally possible to combine the structures of the second and third embodiments.

The operation of the third embodiment will hereinafter be explained referring to FIG. 7.

First, the wavelength selection control signal is controlled such that a current corresponding to a wavelength desired to be taken out is caused to flow through wavelength control terminals of the tunable filter 1 and the local oscillator 10, based on the relationship between the wavelength control currents of the tunable filter 1 and the local oscillator 10 and their center filtering or oscillation wavelengths. The wavelength selection control signal is converted into a current by the voltage-to-current converter 7 and the wavelength control currents are supplied to the wavelength control terminals of the tunable filter 1 and the local oscillator 10 such that their center wavelengths are coincident with each other. The local oscillator 10 emits a DC light of thus given wavelength based on such setting.

When multiplexed light signals of plural different wavelengths are input to the system, the signals are branched by the branching device 3 and part thereof is input into the multiplexer 4 while the remaining thereof is input into the tunable filter 1. The part of the input signals and the output light of the local oscillator 10 are multiplexed by the multiplexer 4 and an output thereof is converted into a current signal by the O/E converter 5. Beat frequency signals are output from the O/E converter 5, corresponding to the differences between the wavelength $\lambda_x$ of output of the local oscillator 10 and wavelengths $\lambda_1$-$\lambda_n$ of the respective input light signals. The beat frequency becomes lower as such wavelength difference becomes smaller, so that the beat frequency produced between the wavelength $\lambda_x$ and the wavelength $\lambda_i$ of the desired signal is the lowest one. The beat detector 6 only detects this lowest beat frequency.

The voltage of thus detected beat frequency output from the beat detector 6 is added to the wavelength selection control signal to be supplied to the voltage-to-current converter 7. Output currents of the voltage-to-current converter 7 are controlled such that they cause the center wavelengths of the local oscillator 10 and the tunable filter 1 to approach the desired wavelength $\lambda_i$. A stabilized point is obtained when the wavelengths $\lambda_x$ and $\lambda_i$ come to be equal to each other. The principle is the same as that of the first embodiment. Since the center wavelength of the local oscillator 10 and the center filtering wavelength of the tunable filter 1 are controlled to be equal to each other, a maximum amount of light of the desired wavelength $\lambda_i$ is transmitted through the tunable filter 1 at the stabilized point. Thus, similar to the first embodiment, a light signal of any desired wavelength can be taken out of the multiplexed light signals of plural different wavelengths.

Although, in the above-discussed embodiments, the tunable filter 1 radiates a DC current caused by a current flow through its gain control terminal from the current source 2, in the following embodiments, a tunable filter does not emit such DC light.

Figure 8:
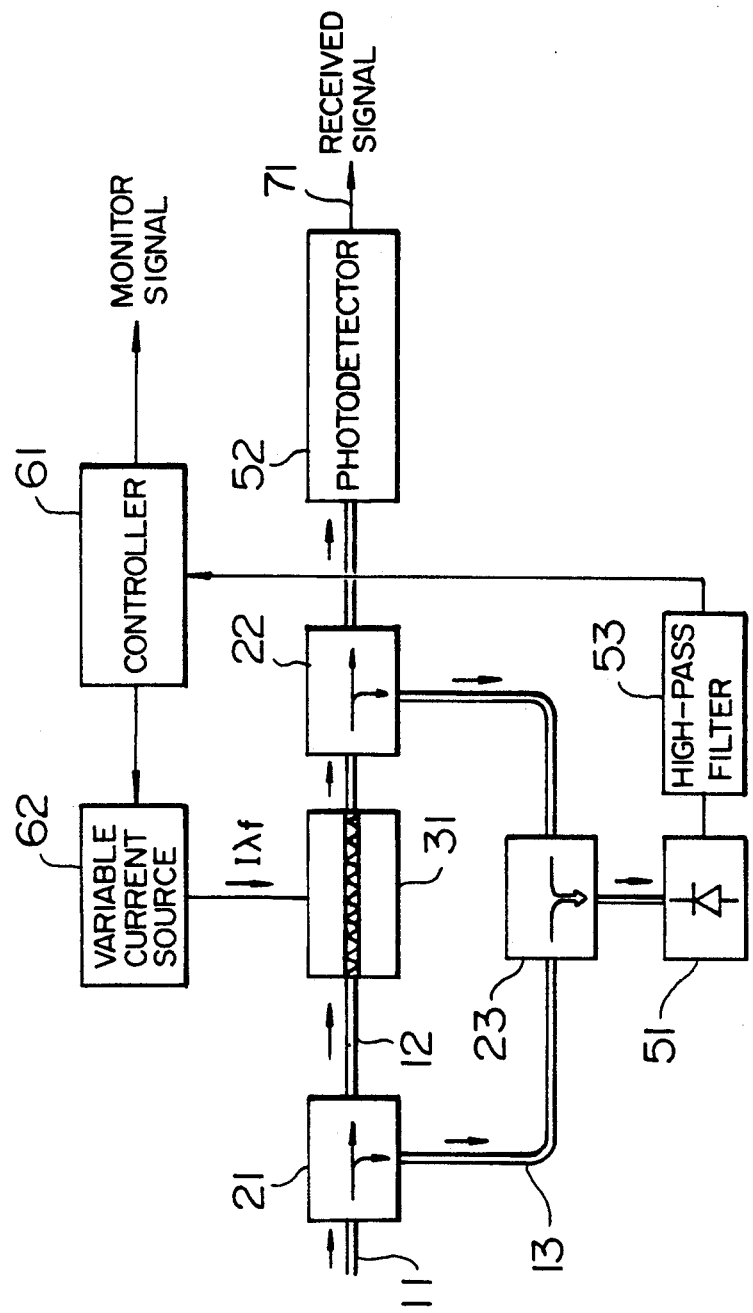
FIG. 8 is a block diagram showing the structure of a fourth embodiment according to the present invention.

FIG. 8 shows a fourth embodiment of the present invention.

In FIG. 8, there are provided optical transmission paths 11, 12 and 13 such as optical fibers or the like, light branching devices 21 and 22, a light combining device 23, a tunable filter 31 which is capable of changing a transmission wavelength by changing an injection current I $\lambda_f$ thereinto, a light receiving device 51 having a nonlinear characteristic, a control circuit or controller 61 for controlling the injection current into the tunable filter 31 by processing a signal from the light receiving device 51 and a current source 62 for injecting the current I $\lambda_f$ into the tunable filter 31 according to a signal from the control circuit 61. Further, there are provided a photodetector 52 for converting a signal of a desired wavelength filtered by the tunable filter 31 into an electric signal and a high-pass filter 53 for removing transmitted signal components from an output of the light receiving device 51.

As the tunable filter 31, a distributed feedback (DFB) laser type filter and the like can be used (see, for example, Numai et al.: Tunable filter using a phase shift type DFBLD, Informal Paper No. C-161 distributed at Autumnal Grand Meeting of Electronics Information Commun. Academy (1988), and Numai: Present state of semiconductor tunable filter, Electronics Information Commun. Academy Thesis Paper C-I, Vol. J 73-C-I, No. 5, pp. 347-353 (May, 1990). As the light branching and combining devices 21, 22 and 23, waveguide type or fiber fusion type devices or the like can be used. As the nonlinear light receiving device 51 and the photodetector 52, a PIN photodiode or the like can be utilized.

Figure 9A:
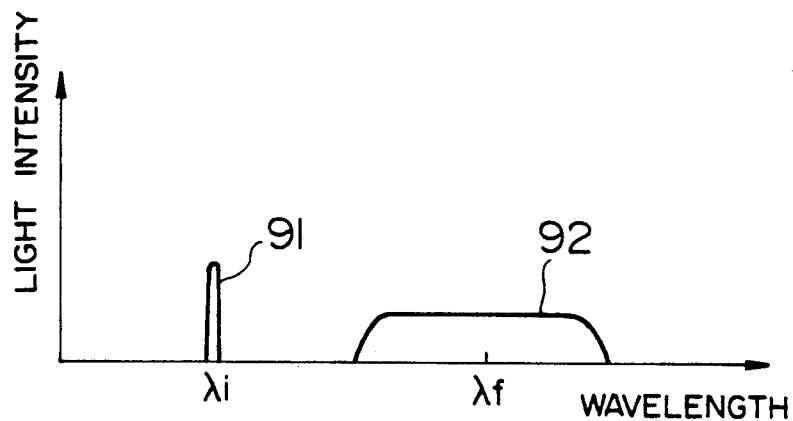
FIGS. 9A and 9B respectively are representations illustrating the relationship between wavelength of a desired signal and transmission wavelength band of a tunable filter.
Figure 9B:
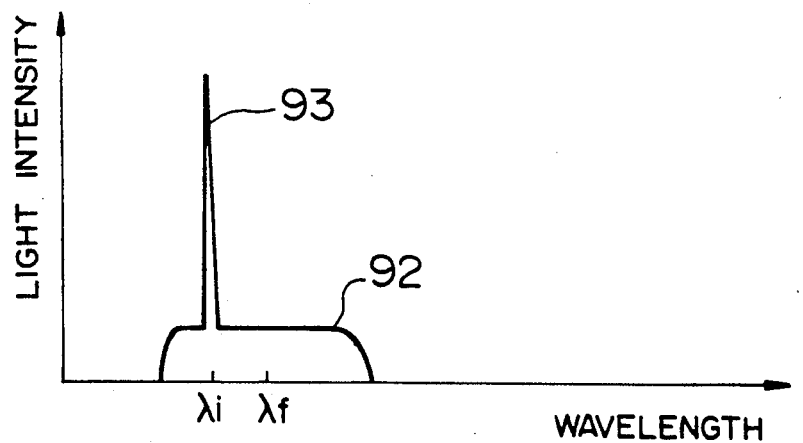

FIGS. 9A and 9B illustrate a manner in which a transmission wavelength band 92 of the tunable filter 31 is caused to be coincident with a signal 91 of desired wavelength $\lambda_i$ in the fourth embodiment. The operation thereof will be explained referring to FIGS. 8, 9A and 9B.

In FIG. 8, light signals of plural wavelengths $\lambda_1, \ldots, \lambda_n$ are transmitted through the transmission path 11. The signal of wavelength $\lambda_i$ is assumed to be a desired one and the center transmission or filtering wavelength $\lambda_f$ of the tunable filter 31 is set to be located near the desired wavelength $\lambda_i$ by roughly controlling the injection current thereto.

The transmitted multiplexed light signals of wavelengths $\lambda_1, \ldots, \lambda_n$ are input into the tunable filter 31. When the wavelength $\lambda_i$ of the desired signal is without the transmission band 92 of the tunable filter 31, the desired signal is blocked by the tunable filter 31 and is not output to the branching device 22. When the wavelength $\lambda_i$ of the desired signal falls within the transmission band 92 of the tunable filter 31 as shown in FIG. 9B, the desired signal is transmitted through the tunable filter 31 and output into the branching device 22. Part thereof is branched by the branching device 22 and supplied to the light receiving device 51 through the combining device 23, and the remaining thereof is sent out to the photodetector 52 to be converted into an electric signal 71 therein which will be a received signal.

As shown in FIG. 9A, when the wavelength $\lambda_i$ of the desired signal is without the transmission band 92 of the tunable filter 31, only light branched by the branching device 21 enters the light receiving device 51 and a signal component carried by the light of wavelength $\lambda_i$ is output from the light receiving device 51. However, a cut-off frequency of the high-pass filter 53 is set so as to remove such signal component, so that the signal component is not transmitted to the control circuit 61.

As shown in FIG. 9B, when the wavelength $\lambda_i$ of the desired signal falls within the transmission band 92 of the tunable filter 31, lights branched by both the branching devices 21 and 22 simultaneously enter the light receiving device 51. At this time, a beat signal created by the two branched lights due to the nonlinear characteristic of the light receiving device 51 as well as the signal component carrier by the light of wavelength $\lambda_i$ is output from the light receiving device 51. Where a semiconductor laser is used as a light source for emitting light of the wavelength $\lambda_i$, time-dependent fluctuation exists in the wavelength and there exists a difference in an optical length between the two lights branched by the respective branching devices 21 and 22. As a result, a beat signal is produced. The beat signal has components in a wide frequency width including a far higher frequency than that of the signal carried by the light of wavelength $\lambda_i$, so that the beat signal is not removed by the high-pass filter 53 to be transmitted to the control circuit 61.

Therefore, the control circuit 61 can detect if or not the transmission band 92 of the tunable filter 31 accords with the wavelength $\lambda_i$ of the desired signal by monitoring the output from the high-pass filter 53.

When the transmission band 92 of the tunable filter 31 does not accord with the wavelength $\lambda_i$ of the desired signal, the control circuit 61 controls the variable current source 62 to change the injection current I $\lambda_f$ and shifts the center filtering wavelength $\lambda_f$ of the tunable filter 31 until the beat signal is output from the high-pass filter 53 or until the wavelength $\lambda_i$ of the desired signal falls within the transmission band 92 of the tunable filter 31.

While the signal is being received, there happens a situation in which the wavelength $\lambda_i$ of the received signal or the center transmission wavelength $\lambda_f$ is fluctuated due to the above-mentioned change in temperature or for other reasons. In such case, if the wavelength $\lambda_i$ approaches the edge of the transmission band 92 of the tunable filter 31, the intensity of output signal 93 from the tunable filter 31 decreases and hence also that of the light branched by the branching device 22 and sent to the light receiving device 51 is reduced. As a result, the intensity of the beat signal output from the light receiving device 51 is decreased. Therefore, the control circuit can detect such decrease and control the variable current source 62 to restore the intensity of the beat signal. Thus, the center transmission wavelength $\lambda_f$ of the tunable filter 31 can be changed. Therefore, it is possible to maintain a preferable receiving condition by monitoring the intensity of the beat signal output from the light receiving device 51 to cause the tunable filter 31 to track the desired wavelength $\lambda_i$.

Figure 10:
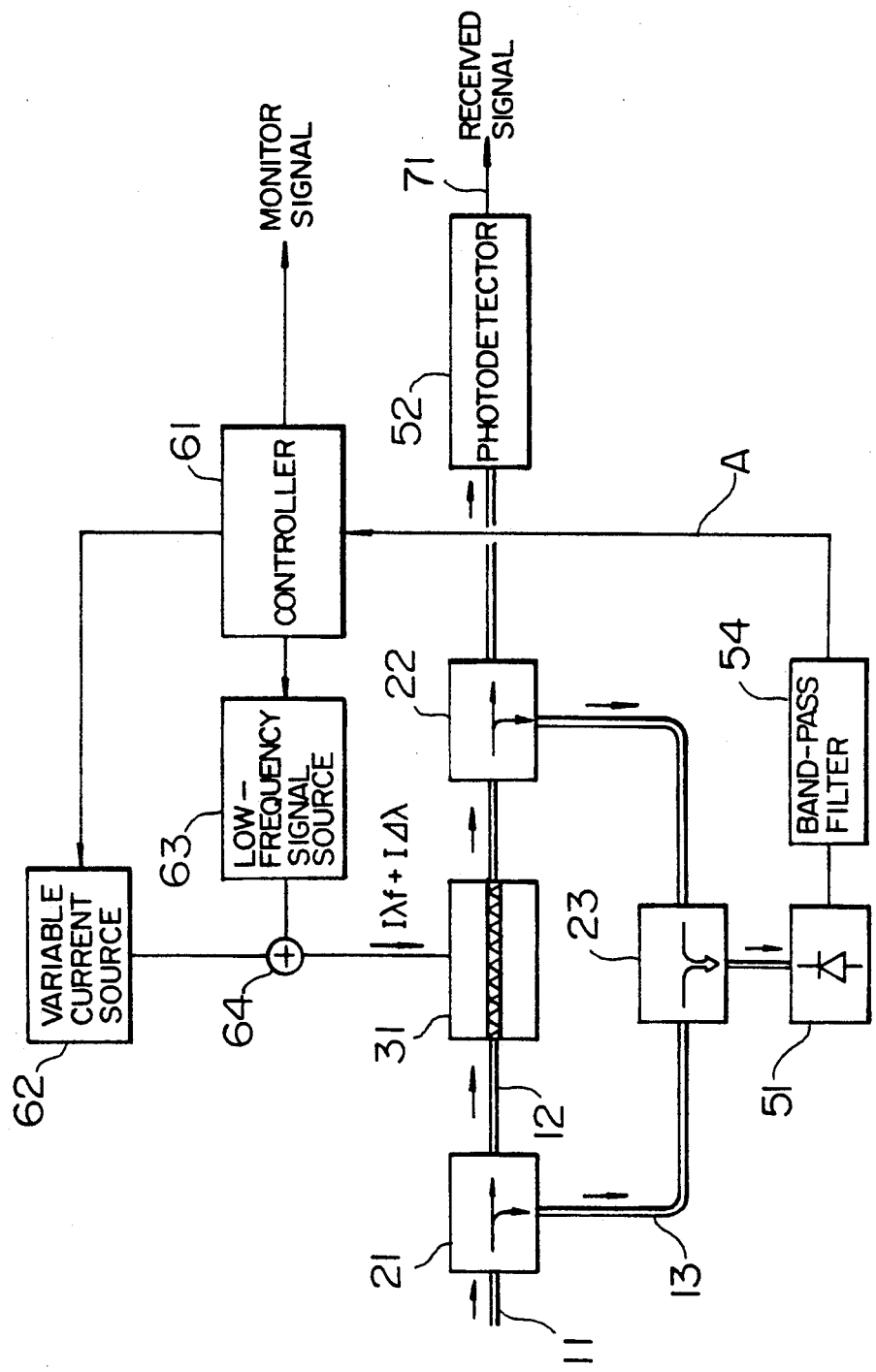
FIG. 10 is a block diagram showing the structure of a fifth embodiment according to the present invention.

FIG. 10 shows a fifth embodiment of the present invention, and FIGS. 11A-11D illustrate respective waveforms for explaining the operation of the fifth embodiment. In FIG. 10, the same reference numerals as those in FIG. 8 denote the same devices or portions as those shown in FIG. 8. The fifth embodiment differs from the fourth embodiment in that a low-frequency signal source 63 and a mixer 64 are disposed between the control circuit 61 and the tunable filter 31 and that there is provided, instead of the high-pass filter 53, a band-pass filter 54 which removes received signals but transmits a signal of a low frequency from the low-frequency signal source 63. In the fifth embodiment, when the control circuit 61 performs a tuning operation at the start of signal receiving, the center wavelength of the transmission band of the tunable filter 31 can be accorded with the wavelength of a desired signal.

If the tuning operation is started when the wavelength $\lambda_i$ of the desired signal is not within the transmission band 92 of the tunable filter 31, the control circuit 61 causes the low-frequency signal source 63 to operate, and a current from the variable current source 62 added to the low frequency signal from the low-frequency signal source 63 is injected into the tunable filter 31. Then, the transmission band 92 of the tunable filter 31 vibrates about a wavelength $\lambda_f$ determined by a current value I $\lambda_f$ from the variable current source 62 with an amplitude $\Delta\lambda$ determined by the current amplitude I $\Delta\lambda$ from the low-frequency signal source 63.

When the desired wavelength $\lambda_i$ is not within a wavelength range of $\lambda_f \pm \Delta\lambda$, no output is emitted from the band-pass filter 54 similar to the fourth embodiment. At this time, the control circuit 61 controls the variable current source 62 to change the wavelength $\lambda_f$. When the wavelength $\lambda_i$ comes to fall within the edge of a range $\lambda_f + \Delta\lambda$ as shown in FIG. 11A, a beat signal begins to be generated once per each period of a signal from the low-frequency signal source 63 as shown in FIG. 11A (see waveform of A). Further, when the wavelength $\lambda_i$ approaches the wavelength $\lambda_f$, the beat signal begins to be generated twice per each period of the signal from the low-frequency signal source 63 as shown in FIG. 11B (see waveform A). When the desired wavelength $\lambda_i$ becomes equal to the wavelength $\lambda_f$, the beat signal generated twice per each period of the signal from the low-frequency signal source 63 appears equidistantly as shown in FIG. 11C, while the beat signal is not generated equidistatly in other cases. When the wavelength $\lambda_i$ falls within the edge of a range of $\lambda_f - \Delta\lambda$ as shown in FIG. 11D, the beat signal again begins to be generated once per each period of the signal from the low-frequency signal source 63 differently from the case of FIG. 11A, as shown in FIG. 11D.

Thus, the control circuit 61 can cause the center transmission wavelength $\lambda_f$ of the tunable filter 31 to be coincident with the wavelength $\lambda_i$ of the desired signal by controlling the current value I $\lambda_f$ such that the beat signal generated twice per each period of the signal from the low-frequency signal source 63 appears equidistantly as shown in FIG. 11C. After that, the control circuit 61 stopps the operation of the low-frequency signal source 63 and a signal receiving operation is in turn started.

In the fifth embodiment, at an initial stage the center transmission wavelength $\lambda_f$ of the tunable filter 31 can be brought to the wavelength $\lambda_i$ of the desired signal, so that the wavelength $\lambda_i$ will not fall without the transmission band 92 of the tunable filter 31 in spite of small fluctuations of the wavelengths $\lambda_i$ and $\lambda_f$. The signal receiving operation of the fifth embodiment is the same as that of the fourth embodiment.

As has been explained above, a signal of any desired wavelength can always be taken out stably even if the center wavelength of an input light signal or a tunable filter is fluctuated because a beat signal created between a DC light emitted from the tunable filter and a light signal blocked by the tunable filter (i.e., signal of desired wavelength) is detected and because the tunable filter is controlled based on such detected beat signal such that a signal to be transmitted through the tunable filter is accorded to the signal of desired wavelength. At an initial setting of the tunable filter, there is no need to cause the center wavelength of the tunable filter to accurately coincide with the wavelength of the desired signal. Therefore, there is no inconvenience even if the accuracy of the wavelength selection control signal is poor. The structure of the voltage-to-current converter can also be made simple by using a comparator and so forth.

Further, the tunable filter can effectively be tuned to start a signal receiving operation by branching each of input and output lights of the tunable filter and detecting a beat signal created therebetween by a light receiving device having a nonlinear characteristic. When the wavelength of the signal or transmission wavelength of the tunable filter is fluctuated during the signal receiving operation, such fluctuation is detected and the receiving operation can be prevented from being disabled by controlling the tunable filter.

Figure 12:
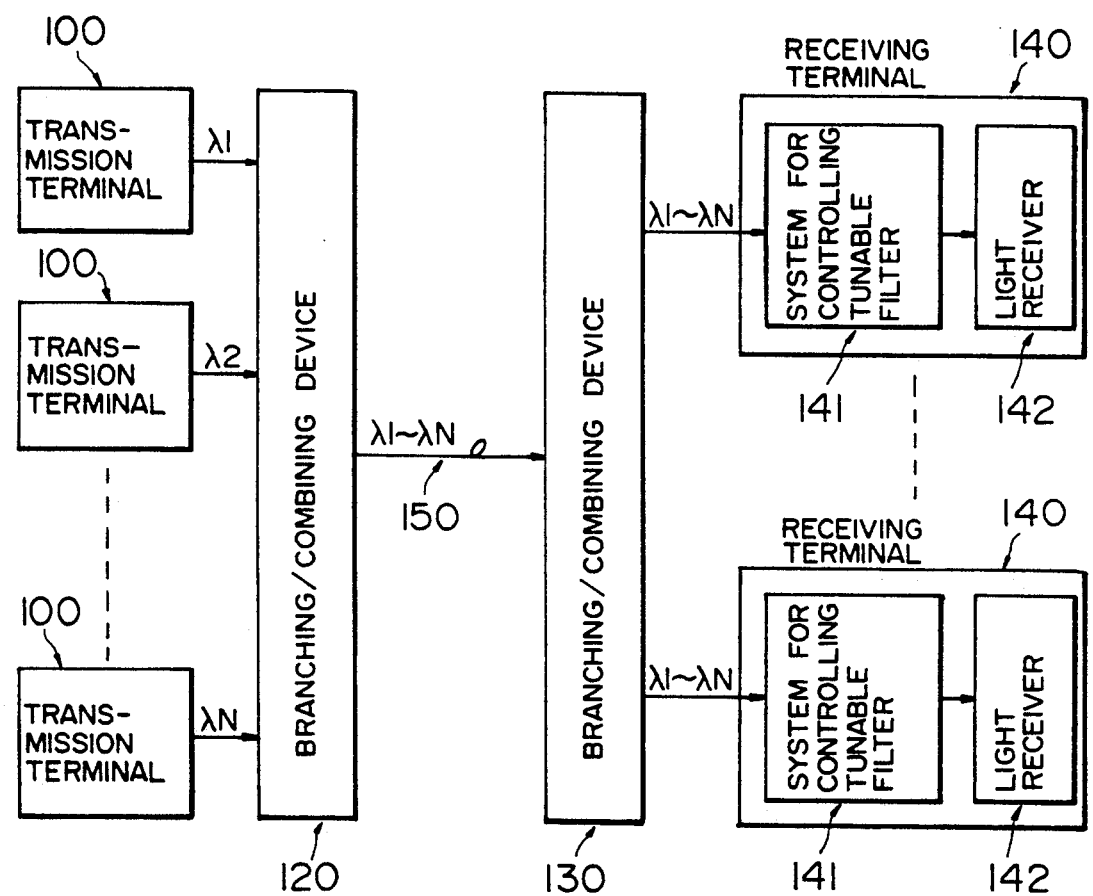
FIG. 12 is a block diagram of an example of optical communication networks including an apparatus for controlling a tunable filter according to the present invention.

FIG. 12 shows a block diagram illustrating an optical communication system in which the embodiment of the present invention is used as an apparatus for controlling a tunable filter. In FIG. 12, reference numeral 100 denotes a transmission terminal, reference numerals 120 and 130 denote light branching/combining devices, reference numeral 140 denotes a receiving terminal, reference numeral 150 denotes an optical transmission path such as an optical fiber or the like, reference numeral 141 denotes the system for controlling the tunable filter of the present invention and reference numeral 142 denotes a light receiver. In FIG. 12, and N number of transmission terminals 100 respectively transmit light signals of different wavelengths, and the signals are multiplexed by the branching/combining device 120 to be transmitted to the transmission path 150. The signals transmitted through the transmission path 150 are branched into an N number of signals to be input into an N number of the receiving terminals 140. In each of the receiving terminals 140, the apparatus for controlling the tunable filter 141 is controlled such that a signal of each desired wavelength is taken out of the multiplexed signals. The thus selected signal is processed by the light receiver 142 to complete the communication from the transmission terminal 100 to the receiving terminal 140.

In the structure of FIG. 12, the branching/combining device 130 may be omitted and the number of the receiving terminals 140 may be reduced to one. Further, a plurality of the transmission terminals 100 and a plurality of the receiving terminals 140 may be connected to each of the branching/combining devices 120 and 130 for performing a bidirectional communication. A bus type network in which transmission and receiving terminals are connected to the optical transmission path through the branching/combining device and the like, a star type network in which the transmission and receiving terminals are connected to one another through a star coupler and the like and a loop type network in which the transmission and receiving terminals are connected by the branching/combining devices can also be utilized to perform the above-discussed frequency division multiplexing communication if the receiving terminal containing the apparatus for controlling the tunable filter according to the present invention is included in the network.

While there has been shown and described what are considered preferred embodiments of the present invention, it will be obvious to those skilled in the art that various changes and modifications may be made therein without departing from the invention as defined by the following claims.

What is claimed is:

1. A method for controlling a tunable filter, said method comprising the steps of:
    generating a reference light whose wavelength is within a transmission wavelength band of the tunable filter;
    detecting a signal generated due to a difference in wavelength between those of a desired component of an input light to be input into the tunable filter and the reference light; and
    controlling the tunable filter based on the signal such that a center filtering wavelength of the transmission wavelength band of the tunable filter substantially coincides with a wavelength of the desire component.

2. A method for controlling a tunable filter according to claim 1, wherein the reference light is generated by causing a current to flow through a gain control terminal of the tunable filter to generate a DC light therefrom.

3. A method for controlling a tunable filter according to claim 1, wherein the reference light is generated by causing the input light to transmit through the tunable filter.

4. A method for controlling a tunable filter according to claim 1, wherein the reference light is generated by causing a local oscillator to emit a DC light whose wavelength band substantially coincides with the transmission wavelength band of the tunable filter.

5. A method for controlling a tunable filter according to claim 1, further comprising the step of causing the transmission wavelength band of the tunable filter to approach the wavelength of the desired component.

6. A method for controlling a tunable filter according to claim 1, further comprising the step of causing the center filtering wavelength of the transmission wavelength band of the tunable filter to vibrate with a predetermined amplitude before a signal receiving operation.

7. A method for controlling a tunable filter according to claim 1, wherein the input light is comprised of multiplexed light signals of a plurality of wavelengths.

8. A method for controlling a tunable filter according to claim 1, wherein the signal is a beat signal detected by a beat detector including a low-pass filter.

9. A method for controlling a tunable filter according to claim 1, wherein the signal is a beat signal detected by light receiving means having a nonlinear characteristic and a high-pass filter.

10. A method for controlling a tunable filter according to claim 1, wherein the signal is a beat signal detected by light receiving means having a nonlinear characteristic and a band-pass filter.

11. A method for controlling a tunable filter according to claim 1, wherein the tunable filter comprises a distributed feedback laser structure.

12. A method for controlling a tunable filter according to claim 2, further comprising the step of reducing the DC light as said controlling step advances.

13. A method for controlling a tunable filter, said method comprising the steps of:
    generating a DC light by the tunable filter;
    detecting a beat signal caused by interaction between the DC light and a desired light signal of multiplexed input light signals of a plurality of wavelengths to be input into the tunable filter, the desired light signal having a wavelength nearest to that of the DC light in said plurality of the wavelengths; and
    controlling the tunable filter based on the beat signal such that a center wavelength of the DC light substantially coincides with the wavelength of the desired light signal.

14. A method for controlling a tunable filter according to claim 13, further comprising the step of reducing the DC light as the center wavelength of the DC light substantially coincides with the wavelength of the desired light signal.

15. A method for controlling a tunable filter, said method comprising the steps of:
    generating a DC light by a local oscillator, said local oscillator being controlled such that a center wavelength thereof substantially coincides with a center filtering wavelength of the tunable filter;
    detecting a beat signal caused by interaction between the DC light and a desired light signal of multiplexed input light signals of a plurality of wavelengths to be input into the tunable filter, the desired light signal having a wavelength nearest to that of the DC light in said plurality of the wavelengths; and controlling the tunable filter and the local oscillator based on the beat signal such that the center filtering wavelength of the tunable filter substantially coincides with the wavelength of the desired light signal.

16. A method for controlling a tunable filter, said method comprising the steps of:
inputting multiplexed input lights of a plurality of wavelengths into the tunable filter;
producing part of the input lights and part of an output light from the tunable filter by branching the input lights and the output light;
receiving the part of the input lights and the part of the output light by light receiving means having a nonlinear characteristic to generate a beat signal caused by interaction between a light of a desired wavelength of the input lights and the part of the output light; and
controlling the tunable filter based on the beat signal such that a center filtering wavelength of the tunable filter substantially coincides with the desired wavelength.

17. A method for controlling a tunable filter according to claim 16, further comprising the step of causing the center filtering wavelength of the tunable filter to vibrate with a predetermined amplitude before a signal receiving operation.

18. An apparatus for controlling a tunable filter, said apparatus comprising:
a tunable filter;
generating means for generating a reference light whose wavelength is within a transmission wavelength band of said tunable filter;
detecting means for detecting a signal generated due to a difference in wavelength between those of a desired component of an input light to be input into said tunable filter and the reference light; and
controlling means for controlling the tunable filter based on the signal such that a center filtering wavelength of the transmission wavelength band of said tunable filter substantially coincides with a wavelength of the desired component.

19. An apparatus for controlling a tunable filter according to claim 18, wherein the reference light is generated by causing a current to flow through a gain control terminal of said tunable filter to generate a DC light therefrom.

20. An apparatus for controlling a tunable filter according to claim 18, wherein the reference light is generated by causing the input light to transmit through the tunable filter.

21. An apparatus for controlling a tunable filter according to claim 18, wherein said generating means comprises a local oscillator and the reference light is generated by causing said local oscillator to emit a DC light whose wavelength band substantially coincides with the transmission wavelength band of said tunable filter.

22. An apparatus for controlling a tunable filter according to claim 18, further comprising vibrating means for causing the center filtering wavelength of the transmission wavelength band of said tunable filter to vibrate with a predetermined amplitude before a signal receiving operation.

23. An apparatus for controlling a tunable filter according to claim 18, wherein said detecting means comprises a beat detector and a low-pass filter for detecting a beat signal of the signal.

24. An apparatus for controlling a tunable filter according to claim 18, wherein said detecting means comprises light receiving means having a nonlinear characteristic and a high-pass filter for detecting a beat signal of the signal.

25. An apparatus for controlling a tunable filter according to claim 18, wherein said detecting means comprises light receiving means having a nonlinear characteristic and a band-pass filter for detecting a beat signal of the signal.

26. An apparatus for controlling a tunable filter according to claim 18, wherein the tunable filter comprises a distributed feedback laser structure.

27. An apparatus for controlling a tunable filter according to claim 19, further comprising means for reducing the DC light as said controlling means causes the center filtering wavelength of the transmission wavelength band of said tunable filter to substantially coincide with the wavelength of the desired component.

28. An apparatus for controlling a tunable filter, said apparatus comprising:
a tunable filter;
generating means for causing said tunable filter to generate a DC light;
detecting means for detecting a beat signal caused by interaction between the DC light and a desired light signal of multiplexed input light signals of a plurality of wavelengths to be input into said tunable filter, the desired light signal having a wavelength nearest to that of the DC light in said plurality of the wavelengths; and
controlling means for controlling the tunable filter based on the beat signal such that a center wavelength of the DC light substantially coincides with the wavelength of the desired light signal.

29. An apparatus for controlling a tunable filter according to claim 28, further comprising reducing means for reducing the DC light as the center wavelength of the DC light substantially coincides with the wavelength of the desired light signal.

30. An apparatus for controlling a tunable filter according to claim 29, wherein said reducing means comprises a low-pass filter and a peak detector.

31. An apparatus for controlling a tunable filter, said apparatus comprising:
a tunable filter;
a local oscillator for generating a DC light, said local oscillator being controlled such that a center wavelength thereof substantially coincides with a center filtering wavelength of said tunable filter;
detecting means for detecting a beat signal caused by interaction between the DC light and a desired light signal of multiplexed input light signals of a plurality of wavelengths to be input into said tunable filter, the desired light signal having a wavelength nearest to that of the DC light in said plurality of the wavelengths; and
controlling means for controlling said tunable filter and said local oscillator based on the beat signal such that the center filtering wavelength of said tunable filter substantially coincides with the wavelength of the desired light signal.

32. An apparatus for controlling a tunable filter, said apparatus comprising:
a tunable filter;

a light combining device;

a first light branching device for branching multiplexed input lights of a plurality of wavelengths into part thereof toward said tunable filter and the remaining thereof toward said light combining device;

a second light branching device for branching an output light from said tunable filter into a received signal and the remaining thereof toward said light combining device;

receiving means having a nonlinear characteristic for receiving an output light from said light combining device to generate a beat signal caused by interaction between a light of a desired wavelength of the input lights and the part of the output light from said tunable filter; and controlling means for controlling said tunable filter based on the beat signal such that a center filtering wavelength of said tunable filter substantially coincides with the desired wavelength.

33. An apparatus for controlling a tunable filter according to claim 32, further comprising vibrating means for causing the center filtering wavelength of said tunable filter to vibrate with a predetermined amplitude before a signal receiving operation.

34. An optical communication network comprising:
a plurality of transmission terminals for respectively transmitting light signals of different wavelengths;

a plurality of receiving terminals for respectively receiving the light signals of different wavelengths;

a optical transmission path for connecting said transmission terminals and said receiving terminals with one-another; and an apparatus for controlling a tunable filter recited in claim 18 contained in at least one of said receiving terminals.

35. A method for controlling a tunable filter, said method comprising the steps of:
generating a reference light whose wavelength is within a transmission wavelength band of the tunable filter;

detecting a wavelength difference between a desired component of an input light to be input into the tunable filter and the reference light; and controlling the tunable filter based on the detected wavelength difference such that a center filtering wavelength of the transmission wavelength band of the tunable filter substantially coincides with a wavelength of the desired component.

36. a method for controlling a tunable filter according to claim 35, wherein said wavelength difference is detected by an interaction signal caused by interaction between the desired component and the reference light.

37. A method for controlling a tunable filter according to claim 36, wherein the interaction signal is a beat signal detected by a beat detector including a low-pass filter.

38. A method for controlling a tunable filter according to claim 36, wherein the interaction signal is a beat signal detected by light receiving means having a nonlinear characteristic and a high-pass filter.

39. A method for controlling a tunable filter according to claim 36, wherein the interaction signal is a beat signal detected by light receiving means having a nonlinear characteristic and a band-pass filter.

40. A method for controlling a tunable filter according to claim 35, wherein the reference light is generated by causing a current to flow through a gain control terminal of the tunable filter to generate a DC light therefrom.

41. A method for controlling a tunable filter according to claim 40, further comprising the step of reducing the DC light as said controlling step advances.

42. A method for controlling a tunable filter according to claim 35, wherein the reference light is generated by causing the input light to be transmitted through the tunable filter.

43. A method for controlling a tunable filter according to claim 35, wherein the reference light is generated by causing a local oscillator to emit a DC light whose wavelength band substantially coincides with the transmission wavelength band of the tunable filter.

44. A method for controlling a tunable filter according to claim 35, further comprising the step of causing the transmission wavelength band of the tunable filter to approach the wavelength of the desired component.

45. A method for controlling a tunable filter according to claim 35, further comprising the step of causing the center filtering wavelength of the transmission wavelength band of the tunable filter to vibrate with a predetermined amplitude before a signal receiving operation.

46. A method for controlling a tunable filter according to claim 35, wherein the input light comprises multiplexed light signals of a plurality of wavelengths.

47. A method for controlling a tunable filter according to claim 35, wherein the tunable filter comprises a distributed feedback laser structure.

48. An apparatus for controlling a tunable filter comprising:
a tunable filter;

generating means for generating a reference light whose wavelength is within a transmission wavelength band of the tunable filter;

detecting means for detecting a wavelength difference between a desired component of an input light to be inputted into the tunable filter and the reference light; and controlling means for controlling the tunable filter based on the detected wavelength difference such that a center filtering wavelength of the transmission wavelength band of the tunable filter substantially coincides with a wavelength of the desire component.

49. An apparatus for controlling a tunable filter according to claim 48, wherein said detecting means detects an interaction signal caused by interaction between the desired component and the reference light.

50. An apparatus for controlling a tunable filter according to claim 49, wherein said detecting means comprises a beat detector and a low-pass filter for detecting a beat signal of the interaction signal.

51. An apparatus for controlling a tunable filter according to claim 49, wherein said detecting means comprising light receiving means having a nonlinear characteristic and a high-pass filter for detecting a beat signal of the interaction signal.

52. An apparatus for controlling a tunable filter according to claim 49, wherein said detecting means comprises light receiving means having a nonlinear characteristic and a band-pass filter for detecting a beat signal of the interaction signal.

53. An apparatus for controlling a tunable filter according to claim 48, wherein the reference light is generated by causing a current to flow through a gain control terminal of said tunable filter to generate a DC light therefrom.

54. An apparatus for controlling a tunable filter according to claim 53, further comprising means for reducing the DC light as said controlling means causes the center filtering wavelength of the transmission wavelength band of said tunable filter to substantially coincide with the wavelength of the desired component.

55. An apparatus for controlling a tunable filter according to claim 48, wherein the reference light is generated by causing the input light to transmit through the tunable filter.

56. An apparatus for controlling a tunable filter according to claim 48, wherein said generating means comprises a local oscillator and the reference light is generated by causing said local oscillator to emit a DC light whose wavelength band substantially coincides with the transmission wavelength band of said tunable filter.

57. An apparatus for controlling a tunable filter according to claim 48, further comprising vibrating means for causing the center filtering wavelength of the transmission wavelength band of said tunable filter to vibrate with a predetermined amplitude before a signal receiving operation.

58. An apparatus for controlling a tunable filter according to claim 48, wherein the tunable filter comprises a distributed feedback laser structure.

59. An optical communication network comprising:
a plurality of transmission terminals for respectively transmitting light signals of different wavelengths;
a plurality of receiving terminals for respectively receiving the light signals of different wavelengths;
an optical transmission path for connecting said transmission terminals and said receiving terminals with one another; and
an apparatus for controlling a tunable filter contained in at least one of said receiving terminals including:
a tunable filter;
generating means for generating a reference light whose wavelength is within a transmission wavelength band of the tunable filter;
detecting means for detecting a wavelength difference between a desired component of an input light to be inputted into the tunable filter and the reference light; and
controlling means for controlling the tunable filter based on the detected wavelength difference such that a center filtering wavelength of the transmission wavelength band of the tunable filter substantially coincides with a wavelength of the desire component.

* * * * *

UNITED STATES PATENT AND TRADEMARK OFFICE
CERTIFICATE OF CORRECTION

PATENT NO. : 5,285,059
DATED : February 8, 1994
INVENTOR(S) : TOHRU NAKATA ET AL.

It is certified that error appears in the above-identified patent and that said Letters Patent is hereby corrected as shown below:

Title Page:

AT [56] REFERENCES CITED

Other Publications,
In "A photonic wavelength...etc."
   "lasser diode" should read --laser diode--.
In "1.5 mum...etc."
   "mum" should read --µm-- and
   "lasser diode" should read --laser diode--.

COLUMN 5

Line 15, "EMBODIMENT" should read --EMBODIMENTS--.
Line 68, "tunble" should read --tunable--.

COLUMN 6

Line 20, "becomes disturbances" should read --becomes disturbed--.
Line 25, "portin" should read --portion--.
Line 32, "signal" should read --signals--.

COLUMN 7

Line 65, "is" should be deleted.

UNITED STATES PATENT AND TRADEMARK OFFICE
CERTIFICATE OF CORRECTION

PATENT NO. : 5,285,059
DATED : February 8, 1994
INVENTOR(S) : TOHRU NAKATA ET AL.

It is certified that error appears in the above-identified patent and that said Letters Patent is hereby corrected as shown below:

COLUMN 10

Line 6, "1990)." should read --1990)).--.
Line 25, "are input" should read
--are branched by the branching device 21 and part thereof is input into the nonlinear light receiving device 51 through the combining device 23. The remaining of the multiplexed light signals of wavelengths $\lambda_1$, . . ., $\lambda_n$ are input--.
Line 51, "carrier" should read --carried--.

COLUMN 12

Line 13, "equidistatly" should read --equidistantly--.
Line 26, "stopps" should read --stops--.

COLUMN 13

Line 62, "desire" should read --desired--.

COLUMN 18

Line 46, "desire" should read --desired--.

UNITED STATES PATENT AND TRADEMARK OFFICE
CERTIFICATE OF CORRECTION

PATENT NO. : 5,285,059
DATED : February 8, 1994
INVENTOR(S) : TOHRU NAKATA ET AL.

It is certified that error appears in the above-identified patent and that said Letters Patent is hereby corrected as shown below:

<u>COLUMN 20</u>

Line 26, "desire" should read --desired--.

Signed and Sealed this

Eleventh Day of October, 1994

Attest:

BRUCE LEHMAN

*Attesting Officer*     *Commissioner of Patents and Trademarks*